(12) United States Patent
Kronholz et al.

(10) Patent No.: US 9,029,919 B2
(45) Date of Patent: May 12, 2015

(54) METHODS OF FORMING SILICON/GERMANIUM PROTECTION LAYER ABOVE SOURCE/DRAIN REGIONS OF A TRANSISTOR AND A DEVICE HAVING SUCH A PROTECTION LAYER

(71) Applicant: GLOBALFOUNDRIES Inc., Grand Cayman (KY)

(72) Inventors: Stephan Kronholz, Dresden (DE); Joachim Patzer, Langebrueck (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 140 days.

(21) Appl. No.: 13/757,205

(22) Filed: Feb. 1, 2013

(65) Prior Publication Data

US 2014/0217480 A1    Aug. 7, 2014

(51) Int. Cl.
*H01L 29/66* (2006.01)
*H01L 29/78* (2006.01)

(52) U.S. Cl.
CPC .......... *H01L 29/66477* (2013.01); *H01L 29/78* (2013.01)

(58) Field of Classification Search
CPC ............ H01L 29/66636; H01L 29/7848; H01L 29/78; H01L 29/66477
See application file for complete search history.

(56) References Cited

U.S. PATENT DOCUMENTS

| | | |
|---|---|---|
| 8,071,442 B2 | 12/2011 | Kronholz et al. |
| 8,124,467 B2 | 2/2012 | Kronholz et al. |
| 2010/0164014 A1 | 7/2010 | Kronholz et al. |
| 2010/0164016 A1 | 7/2010 | Kronholz et al. |
| 2010/0164020 A1 | 7/2010 | Kronholz et al. |
| 2010/0289114 A1 | 11/2010 | Kronholz et al. |
| 2012/0056245 A1* | 3/2012 | Kang et al. ............. 257/192 |
| 2012/0129301 A1* | 5/2012 | Or-Bach et al. ........ 438/129 |
| 2013/0026538 A1* | 1/2013 | Liao et al. .............. 257/190 |

* cited by examiner

*Primary Examiner* — Whitney T Moore
(74) *Attorney, Agent, or Firm* — Amerson Law Firm, PLLC

(57) ABSTRACT

Disclosed herein are various methods of forming a silicon/germanium protection layer above source/drain regions of a transistor. One method disclosed herein includes forming a plurality of recesses in a substrate proximate the gate structure, forming a semiconductor material in the recesses, forming at least one layer of silicon above the semiconductor material, and forming a cap layer comprised of silicon germanium on the layer of silicon. One device disclosed herein includes a gate structure positioned above a substrate, a plurality of recesses formed in the substrate proximate the gate structure, at least one layer of semiconductor material positioned at least partially in the recesses, a layer of silicon positioned above the at least one layer of semiconductor material, and a cap layer comprised of silicon/germanium positioned on the layer of silicon.

18 Claims, 6 Drawing Sheets

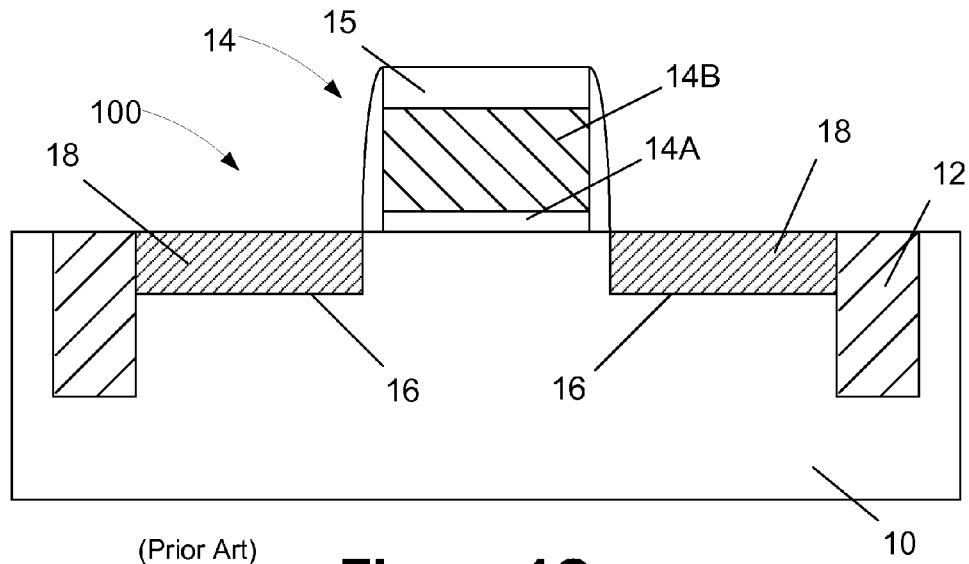
(Prior Art) Figure 1C
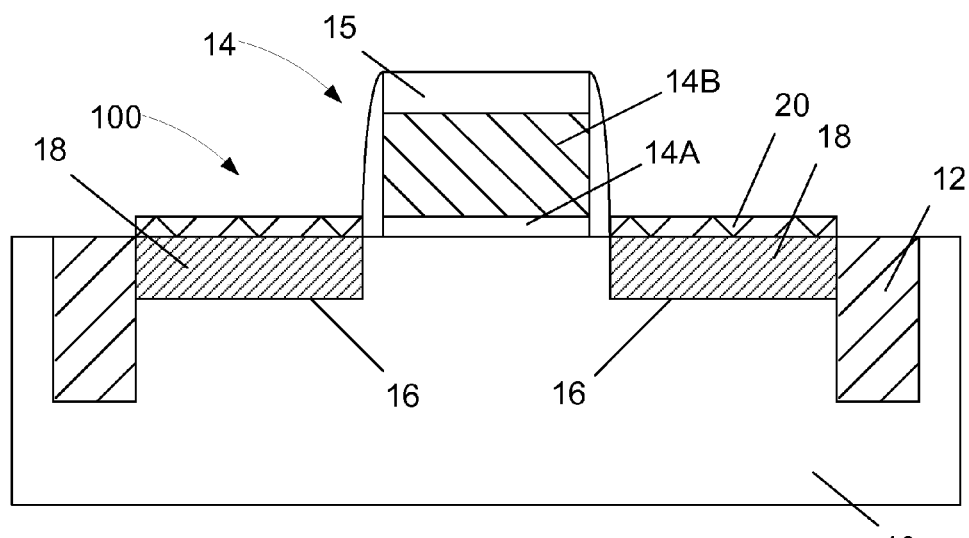
(Prior Art) Figure 1D

METHODS OF FORMING SILICON/GERMANIUM PROTECTION LAYER ABOVE SOURCE/DRAIN REGIONS OF A TRANSISTOR AND A DEVICE HAVING SUCH A PROTECTION LAYER

BACKGROUND OF THE INVENTION

1. Field of the Invention

Generally, the present disclosure relates to the manufacture of sophisticated semiconductor devices, and, more specifically, to various methods of forming a silicon/germanium protection layer above source/drain regions of a transistor.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element that substantially determines the performance capabilities of the integrated circuits. During the fabrication of complex integrated circuits using, for instance, MOS technology, millions of transistors, e.g., NFET transistors and/or PFET transistors, are formed on a substrate including a crystalline semiconductor layer. A basic field effect transistor comprises a source region, a drain region and a channel region extending between the source and drain regions. Such a transistor further includes a gate insulation layer positioned above the channel region and a gate electrode positioned above the gate insulation layer. When an appropriate voltage is applied to the gate electrode, i.e., a voltage that exceeds the threshold voltage of the transistor, the channel region becomes conductive and current may flow from the source region to the drain region. The gate electrode may be made of a variety of materials, e.g., polysilicon, one or more layers of metal, or combinations thereof. The gate structure of the transistor may be made using so-called "gate-first" or "replacement gate" techniques. In one embodiment, the basic structure of a field effect transistor is typically formed by forming various layers of material and thereafter patterning those layers of material using known photolithography and etching processes. Various doped regions, e.g., source regions, drain regions, halo regions, etc., are typically formed by performing one or more ion implantation processes through a patterned mask layer using an appropriate dopant material, e.g., an N-type dopant or a P-type dopant, to implant the desired dopant material into the substrate. The particular dopant selected depends on the specific implant region being formed and the type of device under construction, i.e., an NFET transistor or a PFET transistor. During the fabrication of complex integrated circuits, millions of transistors, e.g., NFET transistors and/or PFET transistors, are formed on a substrate by performing a number of process operations.

In some cases, recessed source/drain regions are formed in the substrate adjacent the gate structure to improve device performance. For example, in PFET transistors, it is common practice to form recessed source/drain regions that are filled with one or more layers of silicon/germanium. Such source/drain regions are also sometimes referred to as "raised" source/drain regions because some of the semiconductor material that is used to form the source/drain regions sometimes is positioned above the upper surface of the substrate, although such a "raised" configuration is not depicted in the attached figures.

FIGS. 1A-1D depict one illustrative process flow for forming illustrative and simplistically depicted recessed source/drain regions. FIG. 1A is a simplified view of an illustrative transistor 100 at an early stage of manufacturing. The transistor 100 is formed in and above an active region 11 of a semiconducting substrate 10 that is defined by an illustrative trench isolation structure 12 formed in the substrate 10. Several process operations have been performed on the transistor 100 at the point of fabrication depicted in FIG. 1A. Initially, the illustrative isolation structures 12 were formed in the substrate 10 to thereby define the active region 11. Also depicted in FIG. 1A is a gate structure 14 (comprised of an illustrative gate insulation layer 14A and an illustrative gate electrode 14B), a gate cap layer 15 that is formed above the gate electrode 14B, and sidewall spacers 17. Although not depicted in the drawings, at the point of fabrication depicted in FIG. 1A, so-called halo implant regions (not shown) have been formed in the substrate 10, typically by performing an angled ion implant process (with a P-type dopant for an NFET transistor and with an N-type dopant for a PFET transistor) and extension implant regions (not shown) have been formed in the substrate 10 prior to forming the sidewall spacers 17.

Next, as shown in FIG. 1B, one or more etching processes are performed to define a plurality of recesses or cavities 16 in the substrate 10 proximate the gate structure 14. The depth of the recesses 16 may vary depending on the particular application, e.g., 40-80 nm. Next, as shown in FIG. 1C, one or more layers of a semiconductor material 18, typically silicon/germanium, are formed in the recesses 16 by performing one or more selective epitaxial deposition processes during which a dopant material, such as a P-type dopant material (for a PFET transistor), may be introduced in situ as the layer(s) of semiconductor material 18 is being formed.

The depiction of the semiconductor material 18 as a block of material in FIG. 1C is intended to be representative of any of a variety of techniques employed to fill the recesses 16 with semiconductor material. For example, in one illustrative embodiment, the semiconductor material 18 may be comprised of a single layer of silicon/germanium with a germanium concentration of about 25%. In another example, the semiconductor material 18 is comprised of two layers of silicon/germanium: a first layer of silicon/germanium having a thickness of about 20-25 nm and a germanium concentration of about 22-25% that is initially formed in the recesses 16, and a second layer of silicon/germanium having a thickness of about 40-50 nm and a germanium concentration of about 30-45% that is formed on the first layer of silicon/germanium. In yet another example, the semiconductor material 18 may be comprised of three layers of silicon/germanium: a first "seed" layer of silicon/germanium having a thickness of about 20-25 nm and a germanium concentration of about 22-25% that is initially formed in the recesses 16, a second layer of silicon/germanium having a thickness of about 40-50 nm and a germanium concentration of about 25-40% that is formed on the first layer of silicon/germanium, and a third layer of silicon/germanium having a thickness of about 5-20 nm and a germanium concentration of between 15% SiGe to pure silicon that is formed on the second layer of silicon/germanium. Other process schemes may also be employed to form the schematically depicted semiconductor material 18 in the recesses.

Next, as shown in FIG. 1D, a silicon cap layer 20 is formed above the semiconductor material 18 for a variety of purposes. One purpose of the silicon cap layer 20 is to provide material for the formation of a metal silicide region (not shown) for purposes of reducing the contact resistance between the source/drain region of the transistor and a conductive contact (not shown) that will be formed to establish electrical connection to the source/drain regions. Simply put, there must be a sufficient amount of silicon material 20, e.g., about 20 nm or more, above the source/drain regions at the time the metal silicide formation process is performed to as to enable the formation of a stable metal silicide region. If there is insufficient silicon material 20 when the metal silicide regions are formed, then there is a possibility of producing a transistor device 100 with reduced performance capabilities and/or one that is completely non-functional. Thus, in the case where about 20 nm of silicon is required for proper metal silicide formation, the silicon cap layer 20 may be manufactured "extra thick," e.g., to a thickness of about 30-40 nm, in an attempt to avoid the problems that may occur should there not be enough silicon present during the silicide formation process.

Another problem that device manufacturers have to account for is the fact that the layer of silicon will be exposed to several additional cleaning and/or etching processes that are performed to manufacture other aspects of the device 100. Unfortunately, these additional cleaning and/or etching processes consume portions of the layer of silicon 20. Thus, to insure that there is a sufficient amount of silicon material 20 for the metal silicide formation process, device manufacturers tend to make the layer of silicon 20 relatively thick, e.g., about 40-50 nm, to account for the unavoidable loss of the silicon material during the aforementioned cleaning and/or etching processes. This "solution" is problematic because the formation of such relatively thick layers of silicon 20 is a very time-consuming process that is not really well-suited for the high-volume, high-speed production environment that is the norm in the mass production of integrated circuit products.

The present disclosure is directed to various methods that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a silicon/germanium protection layer above source/drain regions of a transistor. In one example, a method disclosed herein includes forming a gate structure above a semiconducting substrate, forming a plurality of recesses in the substrate proximate the gate structure, forming a semiconductor material that is at least partially positioned in the recesses, forming at least one layer of silicon above the semiconductor material, and forming a cap layer comprised of silicon/germanium on the at least one layer of silicon.

In another illustrative example, a device disclosed herein includes a semiconducting substrate, a gate structure positioned above the semiconducting substrate, a plurality of recesses formed in the substrate proximate the gate structure, at least one layer of semiconductor material positioned at least partially in the recesses, a layer of silicon positioned above the at least one layer of semiconductor material, and a cap layer comprised of silicon/germanium positioned on the layer of silicon.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art example of forming a transistor device with recessed source/drain regions;

Figure 1A:
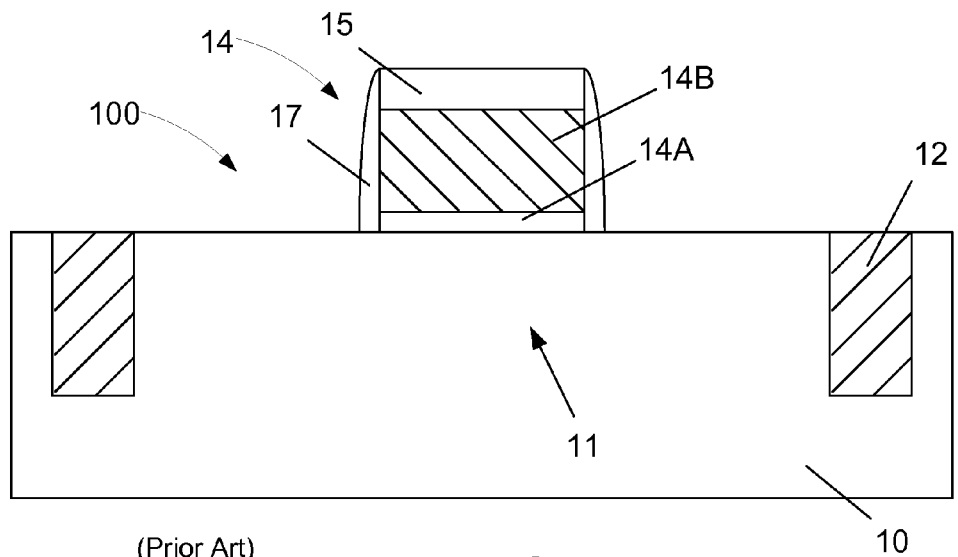
Figure 1B:
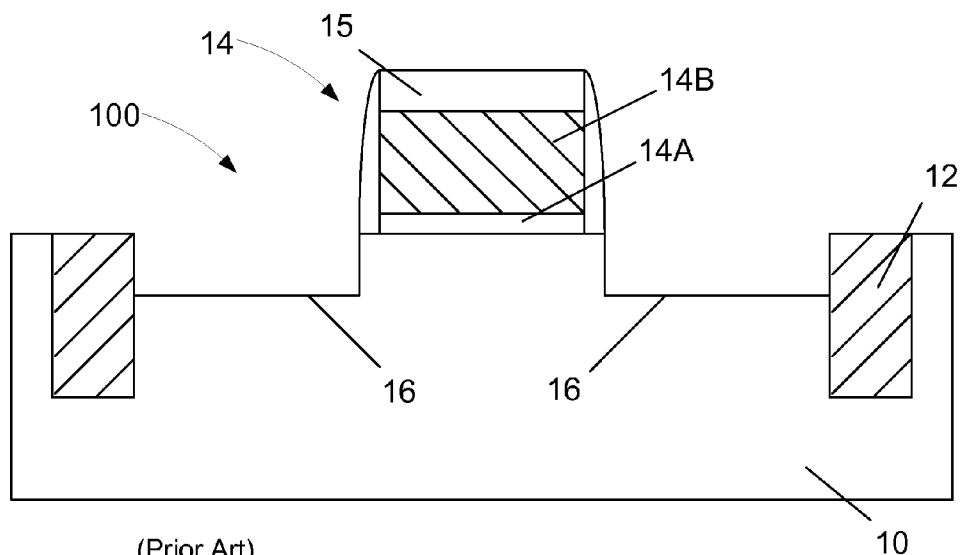

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a silicon/germanium protection layer above source/drain regions of a transistor. As will be readily apparent to those skilled in the art upon a complete reading of the present application, the present methods and systems are applicable to a variety of technologies, e.g., PFET, NFET, CMOS, etc., and they are readily applicable to a variety of devices, including, but not limited to, ASICs, logic devices, memory devices, etc. With reference to the attached figures, various illustrative embodiments of the methods disclosed herein will now be described in more detail.

Figure 2A:
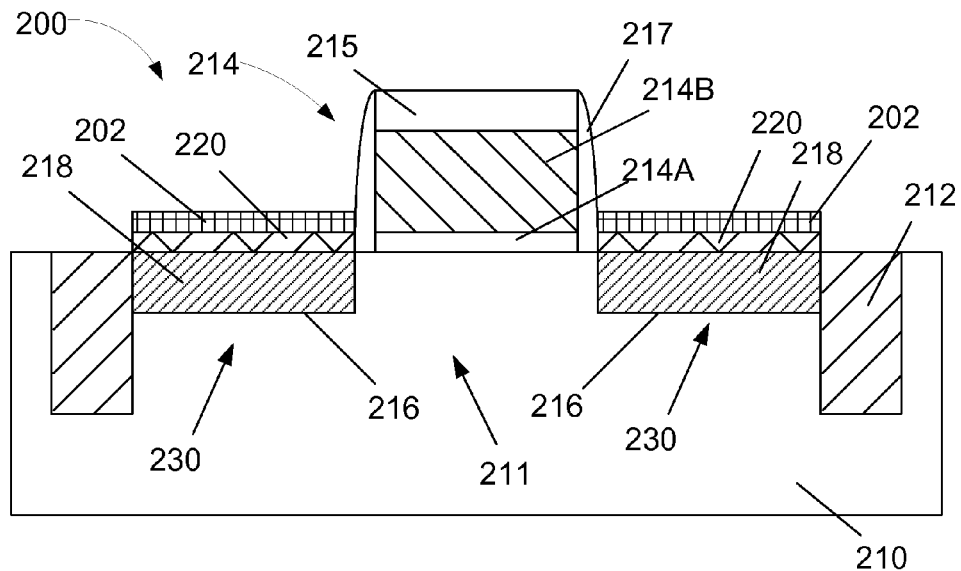
FIGS. 2A-2B depict one illustrative embodiment of a novel transistor device disclosed herein.

FIG. 2A is a simplified view of an illustrative transistor 200 at an early stage of manufacturing. The transistor 200 is formed in and above an active region 211 of a semiconducting substrate 210 that is defined by an illustrative trench isolation structure 212 formed in the substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all semiconductor structures. The substrate 210 may also be made of materials other than silicon.

With continuing reference to FIG. 2A, the transistor 200 is comprised of a gate structure 214 (comprised of an illustrative gate insulation layer 214A and an illustrative gate electrode 214B), a gate cap layer 215 that is formed above the gate electrode 214B and illustrative sidewall spacers 217. Although not depicted in the drawings, at the point of fabrication depicted in FIG. 2A, so-called halo implant regions (not shown) have been formed in the substrate 210, typically by performing an angled ion implant process (with a P-type dopant for an NFET transistor and with an N-type dopant for a PFET transistor) and extension implant regions (not shown) have been formed in the substrate 210 prior to forming the sidewall spacers 217. The gate insulation layer 214A may be comprised of a variety of different materials, such as, for example, silicon dioxide, a so-called high-k (k greater than 10) insulation material, etc. Similarly, the gate electrode 214B may also be of a material such as polysilicon or amorphous silicon, or it may be comprised of one or more metal layers that act as the gate electrode 214B. As will be recognized by those skilled in the art after a complete reading of the present application, the gate structure 214 of the transistor 200 depicted in the drawings, i.e., the gate insulation layer 214A and the gate electrode 214B, is intended to be representative in nature. That is, the gate structure 214 may be comprised of a variety of different materials and it may have a variety of configurations, and the gate structure 214 may be made using either so-called "gate-first" or "gate-last" techniques. In some cases, a relatively thin liner layer and/or spacer(s), e.g., spacers 217, may be formed on the gate structure 214. Thus, when it is stated in this specification or the claims that an etching process is performed to define recesses, as described more fully below, in the substrate 210 "proximate" or "adjacent" the gate structure 214, that terminology should be understood to cover situations where a liner and/or spacer(s) is not present as well as situations in which such a liner and/or spacer(s) are present next to the gate structure 214.

The transistor 200 is also comprised of illustrative source/drain regions 230 that are comprised of regions of semiconductor material(s) 218. In some applications, the semiconductor material 218 may be comprised of one or more layers of a semiconductor material such as, for example, silicon/germanium (perhaps with varying concentrations of germanium), silicon/carbon, Si:P, etc. As another example, the semiconductor material 218 may be comprised of the various layers of silicon/germanium that were as described in the background section of this application for the semiconductor material 18. The semiconductor material(s) 218 are formed in the recesses 216 that were previously formed in the substrate 210 by performing one or more selective epitaxial deposition processes during which a dopant material, such as a P-type dopant material (for a PFET transistor), may be introduced in situ as the layer(s) of semiconductor material 218 is/are being formed. The depiction of the semiconductor material 218 as a block of material in FIG. 2A (and the additional drawings following FIG. 2A) is intended to be representative of any number of layers of one or more types of semiconductor material. The semiconductor material 218 may be manufactured in such a way so as to impart a desired stress (tensile stress for an NFET transistor or compressive stress for a PFET transistor) on what will become the channel region of the transistor 200. The techniques used to form the semiconductor material 218 such that it has the desired stress properties are well known to those skilled in the art.

The transistor 200 is also comprised of a silicon layer 220 positioned above the semiconductor material 218. In one illustrative embodiment, the silicon layer 220 is formed by performing a selective epitaxial deposition process and its thickness may vary depending upon the particular application. In one illustrative embodiment, the silicon layer 220 may have a thickness that falls within the range of about 20-30 nm. Importantly, due to the formation of the protective cap layer 202 (discussed more fully below) above the silicon layer 220, the thickness of the silicon layer 220 may be selected to be the desired thickness needed for the metal silicide formation process, as discussed in the background section of this application. That is, by forming the protective cap layer 202 above the layer of silicon 220, the layer of silicon is not exposed to, or subject to attack by, the various cleaning and/or etching processes that will be performed on the device 200 after the source/drain regions 230 are formed. Thus, using the novel methods disclosed herein, the layer of silicon 220 need not be formed to a greater thickness than is needed for the proper formation of metal silicide regions. Importantly, the time wasted in forming overly-thick silicon cap layers, such as the illustrative silicon cap layer 20 described in the background section of this application, may be avoided.

As mentioned above, the device 200 also includes a protective layer 202 that is formed on the silicon layer 220. The protective layer 202 may be comprised of various materials such as, for example, silicon/germanium (with a germanium concentration up to about 1-15% germanium), etc. In one very particular embodiment, the protective layer 202 may be a layer of silicon/germanium having a germanium concentration of about 10%. In one illustrative embodiment, the protective layer 202 is formed by performing a selective epitaxial deposition process and its thickness may vary depending upon the particular application. For example, in one illustrative embodiment, the protective layer 202 may have a thickness that falls within the range of about 20-30 nm. Importantly, relative to a layer of silicon, the protective cap layer 202 is made of a material that is more etch resistant to many of the cleaning and/or etching processes that will be performed after the source/drain regions 230 for the device are formed. In the case where the protective layer 202 is silicon/germanium, the introduction of the germanium makes the protective layer 202 more resistant to the subsequent cleaning/etching processes as compared to a layer of silicon. Additionally, such a layer of silicon/germanium may be formed at a substantially quicker rate than that of the silicon layer 220, thereby enabling the presently disclosed inventions to be more readily incorporated into high-volume semiconductor manufacturing operations. For example, depending upon the tools and equipment, silicon can be epiatxially grown at a rate of about 4-8 Å/sec while a layer of silicon/germanium with a germanium concentration of about 22% may be epitaxially grown at a rate of about 15-30 Å/sec.

Figure 2B:
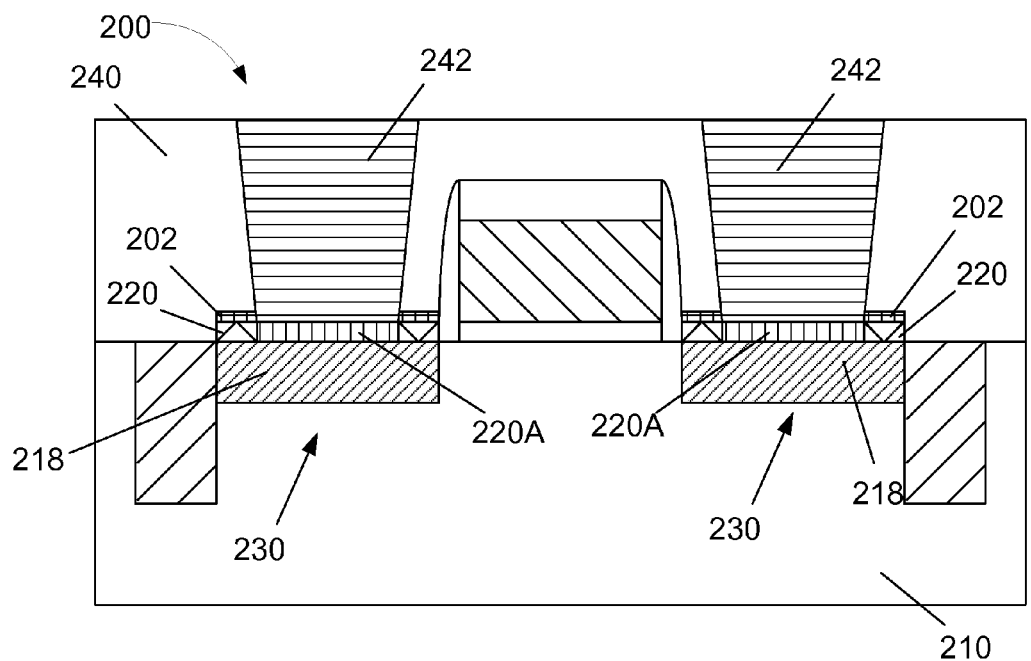

FIG. 2B depicts the device 200 after additional processing operations have been performed. More specifically, at the point of fabrication depicted in FIG. 2B, a layer of insulating material 240, metal silicide regions 220A and conductive contacts 242 have been formed on the device 200 using traditional techniques. Note that some of the protection layer 202 has been consumed as a result of the various processing operations that were performed since the initial formation of the protective layer 202. For example, in one process flow, after the layer of insulating material 240 is formed on the device 200, openings for the conductive contacts 242 are formed in the layer of insulating material 240. The openings in the layer of insulating material 240 expose portions of the underlying protection layer 202. Thereafter, one or more etching processes are performed on the remaining portions of the protection layer 202 through the openings in the layer of insulating material 240 to thereby expose portions of the silicon layer 220. Then, traditional metal silicide formation processes are performed to form the metal silicide regions 220A. The conductive contacts 242 are then formed in the openings in the layer of insulating material using traditional techniques. The conductive contacts 242 are conductively coupled to the metal silicide regions 220A.

Figure 3A:
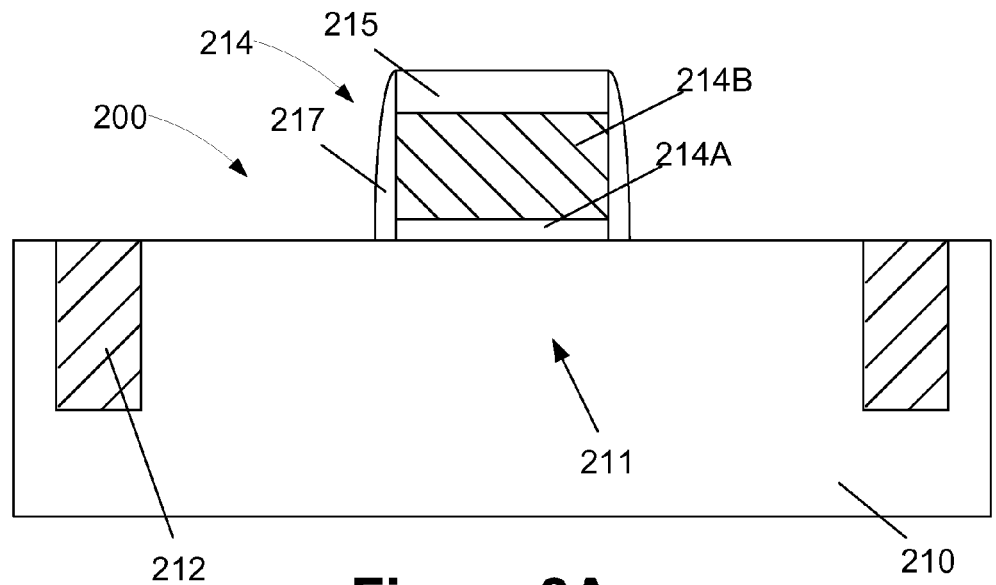
FIGS. 3A-3E depict one illustrative method described herein for forming a silicon/germanium protection layer above source/drain regions of a transistor.

FIGS. 3A-3E depict one illustrative process flow for the transistor device 200 described above in FIGS. 2A-2B. FIG. 3A is a simplified view of the transistor 200 at an early stage of manufacturing after several process operations have been performed on the transistor 200. The transistor 200 is formed in and above an active region 211 of the semiconducting substrate 210 that is defined by the trench isolation structure 212 formed in the substrate 210. The transistor 200 is comprised of the previously described gate structure 214 (comprised of the illustrative gate insulation layer 214A and the illustrative gate electrode 214B), the gate cap layer 215 that is formed above the gate electrode 214B, and sidewall spacers 217. Although not depicted in the drawings, at the point of fabrication depicted in FIG. 3A, so-called halo implant regions (not shown) have been formed in the substrate 210, typically by performing an angled ion implant process (with a P-type dopant for an NFET transistor and with an N-type dopant for a PFET transistor) and extension implant regions (not shown) have been formed in the substrate 210 prior to forming the sidewall spacers 217. The gate insulation layer 214A may be comprised of a variety of different materials such as, for example, silicon dioxide, a so-called high-k (k greater than 10) insulation material, etc. Similarly, the gate electrode 214B may also be of a material such as polysilicon or amorphous silicon, or it may be comprised of one or more metal layers that act as the gate electrode 214B. As will be recognized by those skilled in the art after a complete reading of the present application, the gate structure 214 of the transistor 200 depicted in the drawings, i.e., the gate insulation layer 214A and the gate electrode 214B, is intended to be representative in nature. That is, the gate structure 214 may be comprised of a variety of different materials and it may have a variety of configurations, and the gate structure 214 may be made using either so-called "gate-first" or "gate-last" techniques. The gate structure 214 depicted in FIG. 3A may be the final gate structure for the device 200 or it may be a sacrificial gate structure that may be subsequently removed when traditional "gate-last" techniques are employed to manufacture the device 200.

Figure 3B:
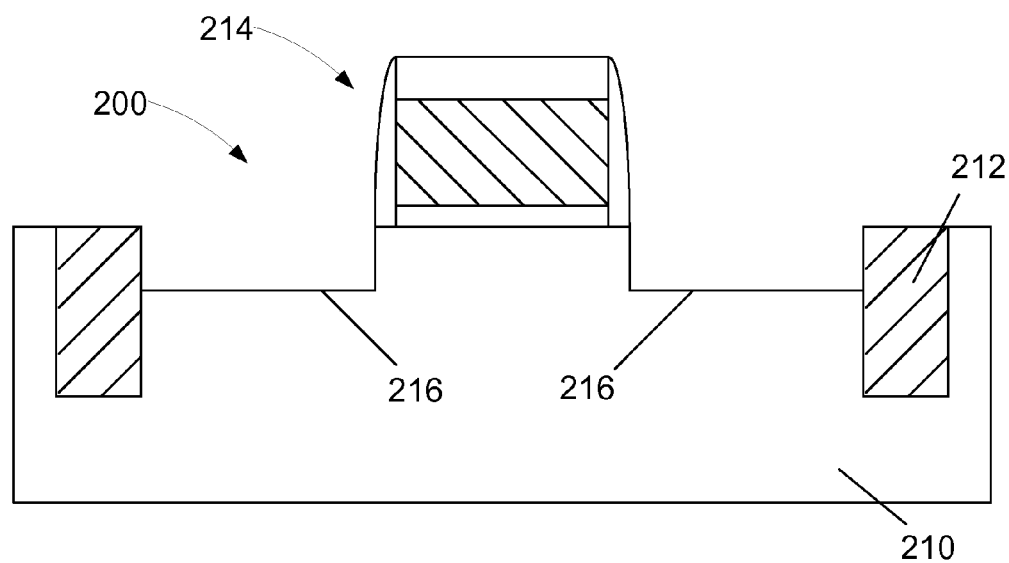

Next, as shown in FIG. 3B, one or more etching processes are performed to define a plurality of recesses or cavities 216 in the substrate 210 proximate the gate structure 214. The depth of the recesses 216 may vary depending on the particular application, e.g., 40-55 nm. In the depicted example, the recesses 216 are formed in a self-aligned manner relative to the spacers 217, although that may not be the case in all applications. For example, it may be the case that the recesses 216 are formed prior to the formation of any liner or spacer adjacent the gate structure 214, or they may be formed after a thin liner layer (not shown) is formed on the gate structure 214 but prior to the formation of the spacers 217. In even other cases, the recesses may not be formed until after an additional liner (not shown) or one or more additional spacers (not shown) are formed on the spacers 217. Thus, when it is stated in this specification or the claims that an etching process is performed to define the recesses 216 in the substrate 210 "proximate" the gate structure 214, that terminology should be understood to cover situations where the recesses 216 are formed in any of the forgoing situations, i.e., without a liner and/or spacer(s) formed adjacent the gate structure 214, as well as situations in which such one or more such liners and/or spacer(s) are present.

Figure 3C:
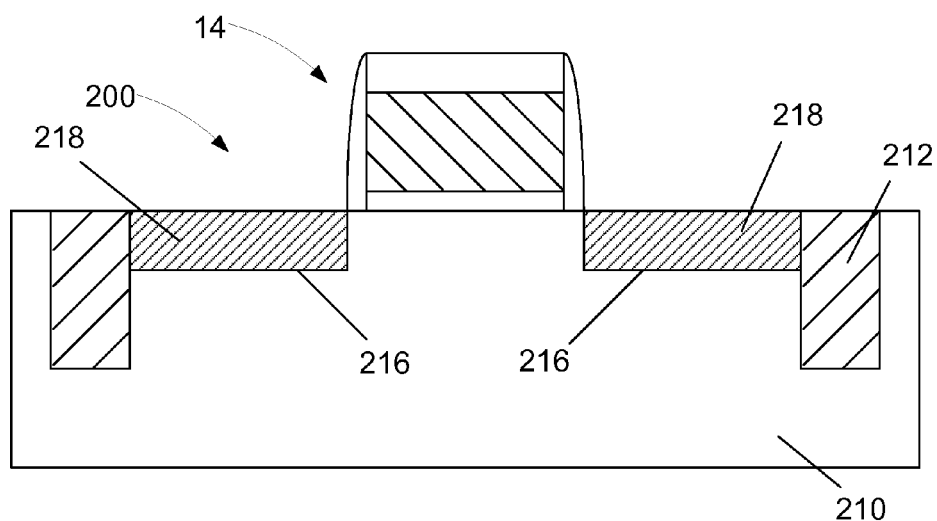

Next, as shown in FIG. 3C, one or more layers of a semiconductor material 218, typically silicon/germanium, are formed in the recesses 216 by performing one or more selective epitaxial deposition processes during which a dopant material, such as a P-type dopant material (for a PFET transistor) or an N-type dopant (for an NFET transistor), may be introduced in situ as the layer(s) of semiconductor material 218 is being formed. As noted previously, the depiction of the semiconductor material 218 as a block of material in FIGS. 2A and 3C (and the additional drawings herein) is intended to be representative of any number of layers of one or more types of semiconductor material. The semiconductor material 218 may be formed in the recesses 216 using a variety of processing schemes, including those identified in the background section of this application. If desired, the semiconductor material 218 may be manufactured in such a way so as to impart a desired stress (tensile stress for an NFET transistor or compressive stress for a PFET transistor) on what will become the channel region of the transistor 200. The techniques used to form the semiconductor material 218 such that it has the desired stress properties are well known to those skilled in the art.

Figure 3D:
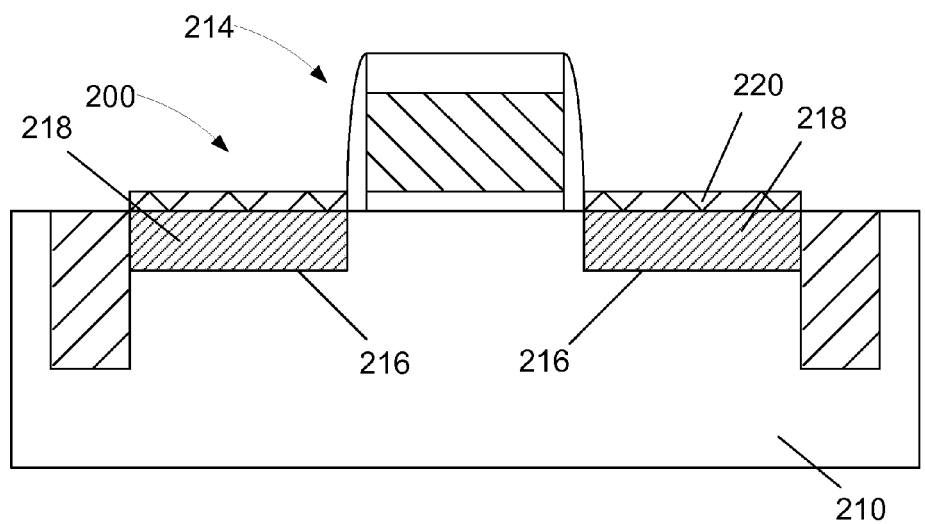

Next, as shown in FIG. 3D, the silicon layer 220 is formed on the semiconductor material 218. The silicon layer 220 may be formed by performing a selective epitaxial deposition process and it may have a thickness that varies depending upon the particular application, e.g., it may have a thickness that falls within the range of about 20-30 nm.

Figure 3E:
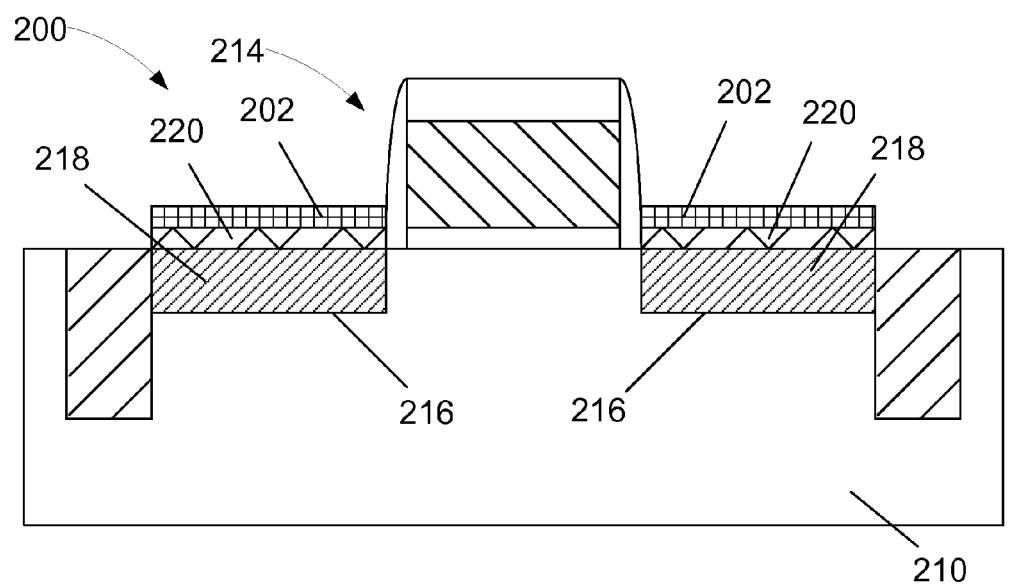

Then, as shown in FIG. 3E, the protection layer 202 is formed on the silicon layer 220. The protection layer 202 may be formed by performing a selective epitaxial deposition process and it may have a thickness that varies depending upon the particular application, e.g., it may have a thickness that falls within the range of about 20-30 nm.

Thus, by employing the protection layer 202 described herein that is more resistant to subsequent etching processes than the silicon cap layer 20 (FIG. 1D), some or all of the problems described in the background section of this application in connection with the formation and use of the silicon cap layer 20 may be avoided or at least reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
   forming a gate structure and a gate cap layer above a semiconducting substrate, said gate cap layer being positioned above said gate structure;
   with said gate cap layer in position above said gate structure, forming a plurality of recesses in said semiconducting substrate proximate said gate structure;
   forming a semiconductor material that is at least partially positioned in said recesses;
   with said gate cap layer in position above said gate structure, performing at least one first selective epitaxial deposition process to selectively form at least one layer of silicon above said semiconductor material; and
   with said gate cap layer in position above said gate structure, performing a second selective epitaxial deposition process to selectively form a protective cap layer comprised of silicon/germanium on said at least one layer of silicon.

2. The method of claim 1, wherein said gate structure is a final gate structure for said transistor.

3. The method of claim 1, wherein, prior to forming said plurality of recesses in said semiconducting substrate, forming sidewall spacers adjacent a sidewall of said gate structure, and wherein forming said plurality of recesses comprises forming a plurality of recesses that are self-aligned relative to said sidewall spacers.

4. The method of claim 1, wherein forming said semiconductor material that is at least partially positioned in said recesses comprises forming a single layer of semiconductor material.

5. The method of claim 1, wherein forming said semiconductor material that is at least partially positioned in said recesses comprises forming a plurality of layers of at least one type of semiconductor material.

6. The method of claim 1, wherein performing said second selective epitaxial deposition process to selectively form said protective cap layer comprised of silicon/germanium on said at least one layer of silicon comprises performing said second selective epitaxial deposition process to selectively form said protective cap layer comprised of silicon/germanium with a germanium concentration of at least 1%.

7. The method of claim 1, wherein said gate structure comprises a gate insulation layer and a gate electrode positioned above said gate insulation layer.

8. The method of claim 1, further comprising:
   forming a layer of insulating material above said protective cap layer and said gate cap layer;
   forming a contact opening in said layer of insulating material that exposes a portion of said protective cap layer;
   performing at least one etching process through said opening in said layer of insulating material to remove said exposed portion of said protective cap layer and thereby expose portions of said at least one silicon layer;
   forming a metal silicide region in said layer of silicon; and
   forming a conductive contact in said contact opening, said conductive contact being conductively coupled to said metal silicide region and extending through said protective cap layer.

9. A method of forming a transistor, comprising:
   forming a gate structure and a gate cap layer above a semiconducting substrate, said gate cap layer being positioned above said gate structure;
   with said gate cap layer in position above said gate structure, performing at least one etching process to form a plurality of recesses in said semiconducting substrate proximate said gate structure;
   with said gate cap layer in position above said gate structure, performing at least one epitaxial deposition process to form a semiconductor material that is at least partially positioned in said recesses;
   with said gate cap layer in position above said gate structure, performing at least one selective silicon epitaxial deposition process to selectively form at least one layer of silicon on said semiconductor material; and
   with said gate cap layer in position above said gate structure, performing at least one epitaxial deposition process to selectively form a protective cap layer comprised of silicon/germanium having a germanium concentration of up to 15% germanium on said at least one layer of silicon.

10. The method of claim 9, further comprising, prior to performing said at least one etching process to form said plurality of recesses in said semiconductor substrate, forming sidewall spacers adjacent a sidewall of said gate structure, and wherein performing said at least one etching process to form said plurality of recesses comprises performing said at least one etching process to form said plurality of recesses that are self-aligned relative to said sidewall spacers.

11. The method of claim 9, wherein said semiconductor material that is at least partially positioned in said recesses is comprised of a single layer of semiconductor material.

12. The method of claim 9, wherein said semiconductor material that is at least partially positioned in said recesses is comprised of a plurality of layers of at least one type of semiconductor material.

13. The method of claim 9, further comprising:
   forming a layer of insulating material above said protective cap layer and said gate cap layer;
   forming a contact opening in said layer of insulating material that exposes a portion of said protective cap layer;
   performing at least one etching process through said opening in said layer of insulating material to remove said exposed portion of said protective cap layer and thereby expose portions of said at least one silicon layer;
   forming a metal silicide region in said layer of silicon; and
   forming a conductive contact in said contact opening, said conductive contact being conductively coupled to said metal silicide region and extending through said protective cap layer.

14. A device, comprising:
   a semiconducting substrate;
   a gate structure positioned above said semiconducting substrate;
   a gate cap layer positioned above said gate structure;
   a sidewall spacer positioned adjacent said gate structure;
   first and second recesses formed in said semiconducting substrate proximate said gate structure;
   at least one layer of semiconductor material positioned at least partially in each of said first and second recesses;
   first and second laterally spaced-apart layers of silicon positioned only above said first and second recesses, respectively, said first and second laterally spaced-apart layers of silicon being positioned on and in contact with said at least one layer of semiconductor material in said first and second recesses, respectively, wherein said first and second layers of silicon contact said sidewall spacer; and
   first and second laterally spaced-apart protective cap layers comprised of silicon/germanium positioned only above said first and second recesses, respectively, said first and second laterally spaced-apart protective cap layers being positioned on and in contact with said layer of silicon positioned above said first and second recesses, respectively, wherein said first and second protective cap layers contact said sidewall spacer.

15. The device of claim 14, wherein said protective cap layers have a germanium concentration of up to 15% germanium.

16. The device of claim 14, wherein said semiconductor material is comprised of a single layer of semiconductor material.

17. The device of claim 14, wherein said semiconductor material is comprised of a plurality of layers of semiconductor material.

18. The device of claim 14, further comprising a conductive contact that extends through said protective cap layers and contacts a metal silicide region positioned above said semiconductor material.

* * * * *